United States Patent
Mnich

(10) Patent No.: US 7,570,094 B2
(45) Date of Patent: Aug. 4, 2009

(54) AUTOMATIC DUTY CYCLE CORRECTION CIRCUIT WITH PROGRAMMABLE DUTY CYCLE TARGET

(75) Inventor: Christopher M. Mnich, Colorado Springs, CO (US)

(73) Assignee: ProMOS Technologies Pte.Ltd., Singapore (SG)

( * ) Notice: Subject to any disclaimer, the term of this patent is extended or adjusted under 35 U.S.C. 154(b) by 45 days.

(21) Appl. No.: 11/767,329

(22) Filed: Jun. 22, 2007

(65) Prior Publication Data

US 2008/0315929 A1    Dec. 25, 2008

(51) Int. Cl.
*H03K 3/017* (2006.01)

(52) U.S. Cl. .................................. 327/175; 327/176

(58) Field of Classification Search ............... None
See application file for complete search history.

(56) References Cited

U.S. PATENT DOCUMENTS

| | | | |
|---|---|---|---|
| 5,013,940 A * | 5/1991 | Ansel | 326/27 |
| 6,172,546 B1 * | 1/2001 | Liu et al. | 327/286 |
| 6,643,790 B1 * | 11/2003 | Yu et al. | 713/500 |
| 6,781,419 B2 | 8/2004 | Harrison | |
| 6,853,225 B2 * | 2/2005 | Lee | 327/158 |
| 6,975,100 B2 | 12/2005 | Doppke et al. | |
| 7,005,913 B2 * | 2/2006 | Diffenderfer | 327/546 |
| 7,015,739 B2 | 3/2006 | Lee et al. | |
| 7,202,720 B2 * | 4/2007 | Kim | 327/158 |
| 7,352,228 B2 * | 4/2008 | Ali et al. | 327/333 |
| 2004/0061525 A1 * | 4/2004 | Tamaki | 326/81 |

* cited by examiner

*Primary Examiner*—An T Luu
(74) *Attorney, Agent, or Firm*—Peter J. Meza; William J. Kubida; Hogan & Hartson LLP

(57) ABSTRACT

A duty cycle correcting circuit for an integrated circuit memory automatically corrects the duty cycle of an input clock by measuring the relative difference between the high time and low time of the input signal and using this measurement to achieve a same-frequency, duty cycle adjusted output signal. The duty cycle correcting circuit includes a duty cycle adjust circuit that uses two series-connected N-channel transistors to control the pull-up slew rate of a signal and another N-channel transistor to control the pull-down slew rate of the same signal, two dual-slope integrator circuits, and input and output signal buffering.

11 Claims, 3 Drawing Sheets

CASCADED DUTY CYCLE ADJUSTERS

AUTOMATIC DUTY CYCLE CORRECTION CIRCUIT WITH PROGRAMMABLE DUTY CYCLE TARGET

BACKGROUND OF THE INVENTION

The present invention relates to integrated circuit memories, and, more particularly, to a circuit for precisely controlling the duty cycle of a clock signal, which is important for the proper operation of a DDR ("Double Data Rate") integrated circuit memory. It has become increasingly important in digital circuits that an accurate 50% duty cycle clock be generated since actions are taken on both the rising and falling edges of the clock.

In DDR chips, data is input and output on both the rising and falling edges of the clock. DDR systems rely on data being valid during a certain window for both edges of the system clock. Therefore, losses in the duty cycle between the input and final output clocks can make it difficult (or even impossible) to find an acceptable strobe window for both clock edges. Additionally, as clock frequencies continue to increase, small errors in the speed of transferring logic "ones" versus logic "zeroes" become a larger percentage loss (or gain) of duty cycle.

A simple solution for addressing poor duty cycle involves the adjustment of P-channel to N-channel ratios in a final driver of the output clock signal. This method requires a new set of masks and is thusly highly inefficient and costly. Also, any further variations in the manufacturing process could cause another modification to be made, further increasing cost and delaying progress.

More advanced methods make use of a dual-slope integrator scheme to indicate when a signal has a 50% duty cycle, which is well known in the art. This scheme uses two current sources of equal magnitude, one to charge an integrating capacitor when the signal is high and the other to discharge the capacitor when the signal is low. When the signal has a 50% duty cycle, there will be no net charge transferred to the capacitor during a clock cycle. When the signal has a duty cycle greater than 50%, the voltage on the capacitor will increase. When the duty cycle is less than 50%, the voltage on the capacitor will decrease. The voltage on the capacitor can, in turn, be used to control the duty cycle; i.e., a "control voltage" is generated. In some cases, two control voltages have been generated, one using the clock and one using the complement of the clock. In this case, the two control voltages move in opposite directions as the duty cycle diverges from 50%.

A number of different techniques have been proposed for using the above described control voltage to adjust the duty cycle. It is also well known that using the same technique with current sources that are not equal can be used to generate signals with precise duty cycles other than 50%.

Examples of the above techniques are described, for example, in U.S. Pat. No. 7,015,739, U.S. Pat. No. 6,781,419 B2, and U.S. Pat. No. 6,975,100 B2.

The duty cycle deviation is the result of the rising and falling edges of a 50% duty cycle input signal propagating at different rates though the circuitry intervening between the input and a point at which the propagated signal is used. A common approach used for adjusting the duty cycle is to add voltage-controlled duty cycle correcting circuitry to the intervening path. The added duty cycle adjusting circuit in this approach uses the control voltage to cause the rising and falling edge propagation rates to differ in opposite directions to that of the circuitry between the input and the added duty cycle correction circuitry. Thus the duty cycle is adjusted toward the desired value.

In U.S. Pat. No. 6,781,419 B2, the well known voltage-controlled inverter is used to adjust the output slew rates of the rising and falling edges in opposite directions thus adjusting the duty cycle. A voltage-controlled current regulating P-channel transistor is used to control the inverter output rising edge slew rate. An N-channel voltage-controlled regulating transistor is used to control the inverter output falling edge slew rate. The control voltages used to control the P-channel and N-channel transistors are derived from the voltage generated by a dual-slope integrator as described above rather than using this voltage directly.

Prior art methods use P-channel transistors to control either the rising edge or falling edge slew rate. With power supply voltages continuing to decrease, the P-channel transistors become much less accurate at performing this control function. The method of the present invention seeks to overcome this deficiency by using only N-channel transistors for the control function. Prior art methods also use various translations and/or digitizations of the dual-slope integrator output voltage. The method of the present invention seeks to overcome this deficiency by using the dual-slope integrator output voltage directly.

What is desired, therefore, is a simple duty cycle correction circuit for use in an integrated circuit memory that precisely controls the duty cycle of a clock signal.

SUMMARY OF THE INVENTION

According to an embodiment of the present invention, a duty cycle correcting circuit automatically corrects the duty cycle of an input clock by measuring the relative difference between the high time and low time of the input signal and using this measurement to achieve a same-frequency, duty cycle adjusted output signal. The duty cycle correcting circuit according to an embodiment of the present invention includes a duty cycle adjust circuit that uses two series-connected N-channel transistors to control the pull-up slew rate of a signal and another N-channel transistor to control the pull-down slew rate of the same signal, two dual-slope integrator circuits, and input and output signal buffering.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DETAILED DESCRIPTION

Figure 1:
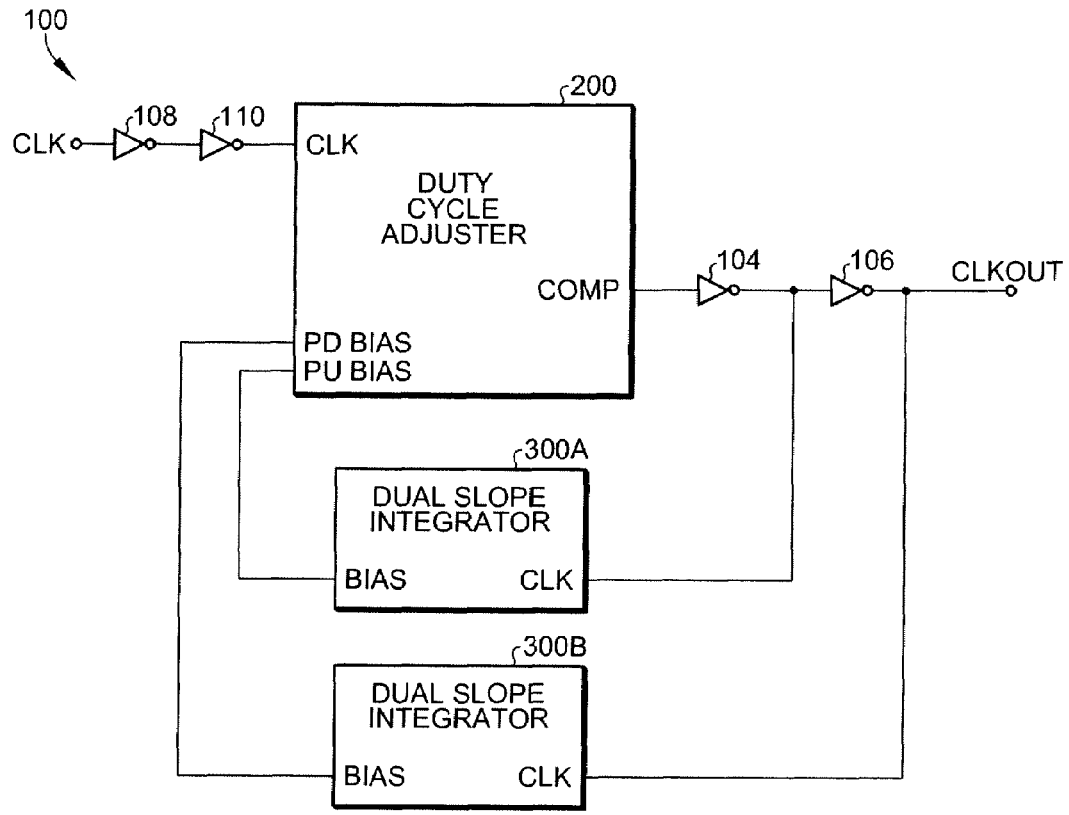
FIG. 1 is a block diagram of the duty cycle correcting circuit according to an embodiment of the present invention, which includes input and output buffering, a duty cycle adjuster circuit, and two dual-slope integrator circuits.

Referring now to FIG. 1, a block diagram of a duty cycle correcting circuit 100 according to the present invention is shown, including a duty cycle adjuster circuit 200, a first dual-slope integrator 300A, a second dual-slope integrator 300B, as well as input and output buffering. The input buffering is provided by inverters 108 and 110. The output buffering is provided by inverters 104 and 106. In FIG. 1, the input of inverter 108 receives the CLK input signal, and the output of inverter 106 provides the CLKOUT output signal. The CLK input of duty cycle adjuster circuit 200 is coupled to the output of inverter 110, and the COMP output is coupled to the input of inverter 104. The pull-up bias (PUBIAS) input is coupled to the BIAS output of integrator 300A, and the pull-down bias input (PDBIAS) is coupled to the BIAS output of integrator 300B. The CLK input of integrator 300A is coupled to the output of inverter 104, and the CLK input of integrator 300B is coupled to the output of inverter 106.

Figure 2:
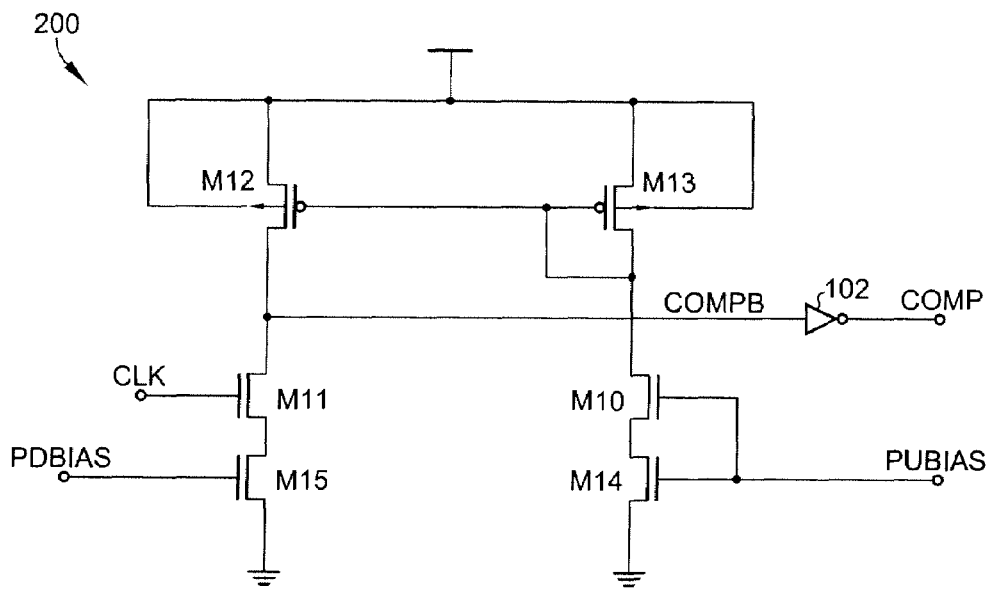
FIG. 2 is a transistor-level schematic for the duty cycle adjuster circuit shown in the block diagram of FIG. 1.

The transistor-level circuit of the duty cycle adjusting circuit 200 used in the present invention is shown in FIG. 2. Multiple instances of circuit 200 can be cascaded to improve the performance of the overall adjusting circuit 100. Circuit 200 uses one N-channel voltage-controlled current regulating transistor M15 to control the pull-down slew rate of an inverter and two N-channel voltage-controlled transistors M10 and M14 in series to control the pull-up slew rate of an inverter. The first N-channel current regulating transistor M15 is connected to the output through a switching transistor M1 that is turned on in response to a rising edge input CLK signal. This regulating transistor M15 thus directly controls the pull-down current at the output. The two N-channel current regulating transistors M10 and M14 in series are connected to a diode connected P-channel transistor M13 that is connected to the power supply voltage. The current through the pair of N-channel current regulating transistors M10 and M14 determines the voltage at the junction between the N-channel transistors and the P-channel transistor M13. This voltage is used to establish the gate voltage, and thus the pull-up current, of a second P-channel transistor M12 connected between the power supply and the output. Two control voltages that move in opposite directions as the CLK duty cycle diverges from 50% are used as separate inputs to the single N-channel current regulating transistor M15 and the pair of N-channel current regulating transistors M10 and M14, respectively. Thus, the propagation delays of the rising and falling edges of the input CLK signal move in opposite directions as they propagate through the adjusting circuit and the duty cycle will be corrected.

In FIG. 2, the gate of transistor M11 receives the input CLK signal, the gate of transistor M15 receives the PDBIAS control signal, and the gates of transistors M10 and M14 receive the PUBIAS control signal. The COMPB output signal is taken at the drain of transistor M12 and is coupled to the input of inverter 102. The COMP output signal is taken at the output of inverter 102. The power terminals of the P-channel transistors M12 and M13 are coupled to a source of power supply voltage, and the sources of transistors M15 and M14 are coupled to ground or VSS.

Figure 3:
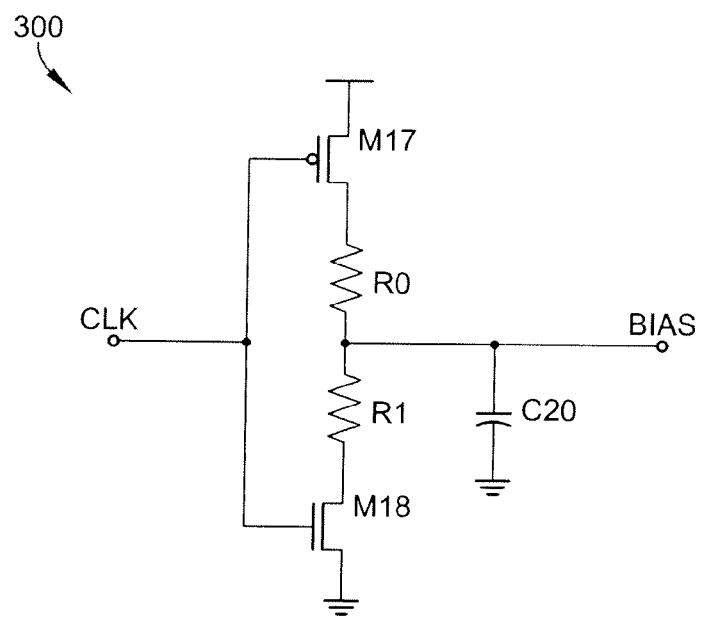
FIG. 3 is a transistor-level schematic for the dual-slope integrator circuits shown in the block diagram of FIG. 1.

One implementation for the generation of the control voltages PDBIAS and PUBIAS uses two dual-slope integrators 300A and 300B. A transistor-level schematic of a single dual-slope integrator 300 is shown in FIG. 3. Two current sources are implemented as large value resistors R0 and R1 that are selectively coupled between the integrating capacitor C20 and the power supply or ground respectively. In the example of circuit 300 shown in FIG. 3, the pull-up current through P-channel transistor M17 is turned on and the pull-down current through N-channel transistor M18 is turned off when the signal CLK is low. Conversely, the pull-up current through P-channel transistor M17 is turned off and the pull-down current through N-channel transistor M18 is turned on when the signal CLK is high. The switching behavior for an inverted CLK signal is of course exactly the opposite. Thus, the voltage on capacitor C20 moves in opposite directions for each of the integrators 300A and 300B in response to the CLKOUT signal (referring momentarily to FIG. 1) as the duty cycle diverges from 50%. The resultant outputs of integrators 300A and 300B (PUBIAS and PDBIAS, respectively) are used directly by the duty cycle adjusting circuit 200. The resistor/transistor combinations shown in FIG. 3 are not perfect current sources, and so there is some residual duty cycle offset when the control voltages stabilize. By minimizing the voltage drop across the transistors and having the voltage stabilize as close to one-half the power supply voltage as possible, the pull-up and pull-down currents will be closer in magnitude.

Figure 4:
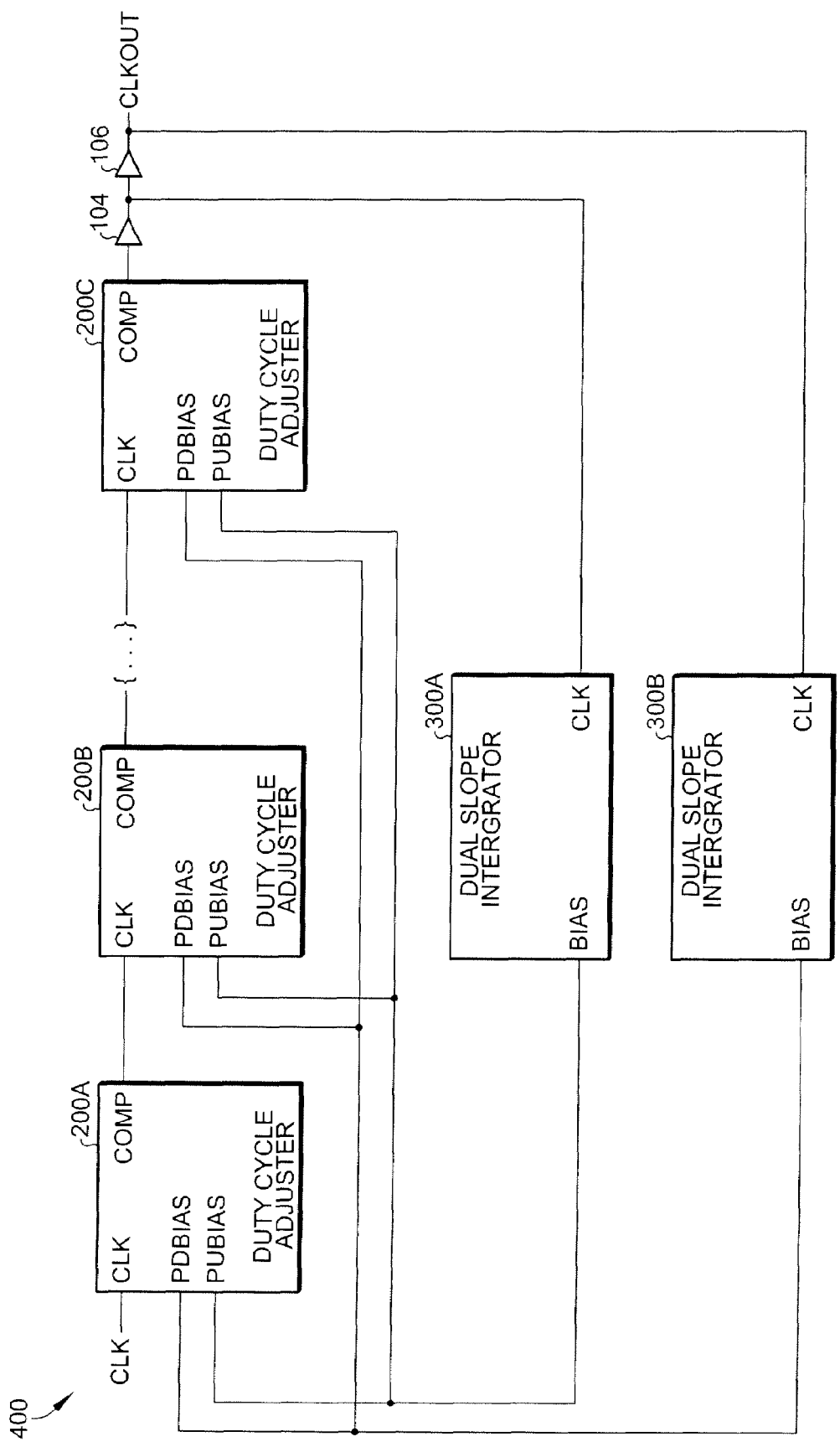
FIG. 4 is a block diagram of cascaded duty cycle correcting circuits.

Minimizing the drop across transistors M18 and M17 can be achieved by proper sizing of the transistors relative to the resistance of resistors R0 and R1. Since the voltage across capacitor C20 is set by the requirements of the adjusting circuit, it cannot be independently set. However, by cascading multiple duty cycle adjusting circuits 200A through 200C as is shown in circuit 400 of FIG. 4, the excursions away from the initialized values can be reduced since the adjustment per circuit stage is less.

Figure 5:
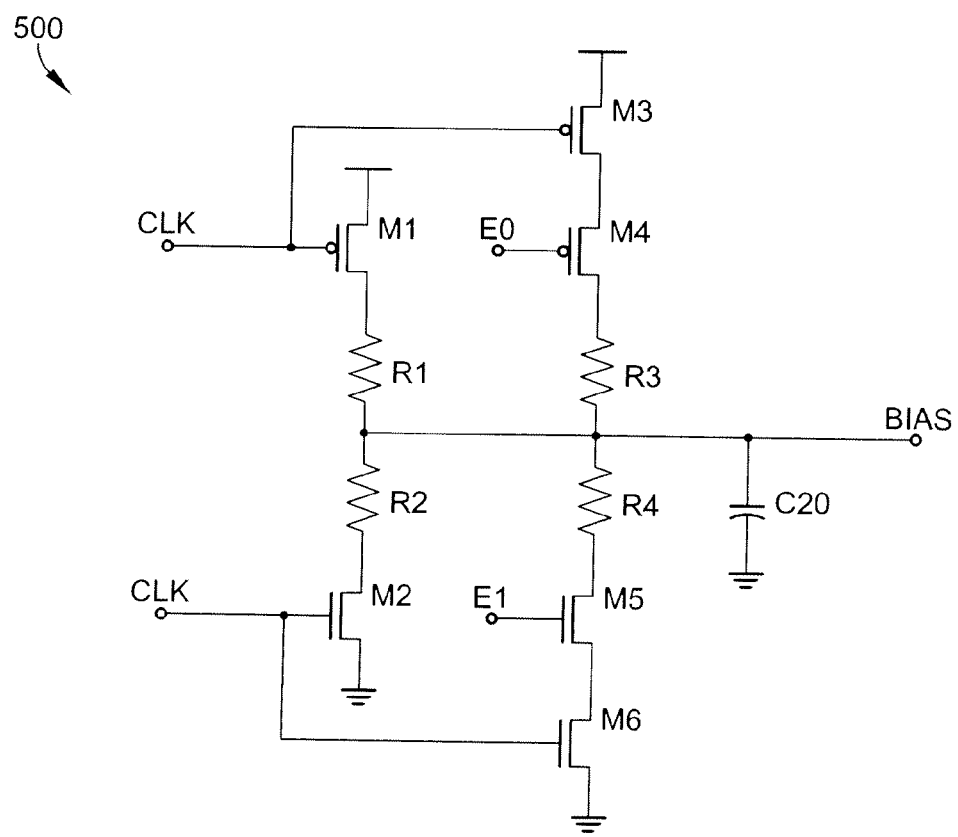
FIG. 5 is an alternative transistor-level schematic for the dual-slope integrator circuit shown in the block diagram of FIG. 1.

For an adjustable duty cycle target of other than 50%, an alternative dual-slope integrator circuit 500 is shown in FIG. 5. In order to accommodate further degradation in duty cycle for signals downstream of the compensation circuit, the following circuit 400 can be used to adjust the duty cycle target away from 50%. Circuit 400 includes two parallel switching circuits. A first circuit includes transistors M1 and M2 each having a gate for receiving the CLKOUT signal. Resistors R1 and R2 are in the signal of transistors M1 and M2. The junction of resistors R1 and R2 is coupled to capacitor C20 for providing the BIAS voltage output. Note that this portion of the circuit is similar to circuit 300 shown in FIG. 3. In addition, circuit 400 includes a second switching circuit including transistors M3, M6, and resistors R3 and R4. The second switching circuit is enabled through the switching action of transistors M4 and M5, which are controlled by gate voltages E0 and E1, respectively. Gate voltages E0 and E1 are used to place resistors R3 and R4 in parallel with the default resistors R1 and R2 to change the behavior of the BIAS voltage to allow CLKOUT to have a non-50% duty cycle. In operation, gate voltages E0 and E1 have different polarities for controlling the pull-up and pull-down currents of the duty cycle adjuster circuit 200. While using different values for resistors R1 and R2 will provide a non-50% duty cycle, the circuit and method of the present invention allows for multiple programmable settings for both 50% duty cycle and non-50% duty cycle settings as desired.

While there have been described above the principles of the present invention in conjunction with specific logic designs and methods of operation, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicant hereby reserves the right to formulate new claims to such features and/or combinations of such features during the prosecution of the present application or of any further application derived therefrom.

We claim:

1. A duty cycle correcting circuit comprising:
   a duty cycle adjuster circuit having a clock input, a pull-down bias input, a pull-up bias input, and a compensated output;
   a first dual-slope integrator having a clock input and a bias output coupled to the pull-up bias input of the duty cycle adjuster circuit;
   a second dual-slope integrator having a clock input and a bias output coupled to the pull-down bias input of the duty cycle adjuster circuit; and
   an output inverter circuit having an input coupled to the compensated output of the duty cycle adjuster circuit, a first output coupled to the clock input of the first dual-slope integrator circuit, and a second output coupled to the clock input of the second dual-slope integrator circuit and for providing a duty cycle compensated output clock signal,
   wherein the duty cycle adjust circuit comprises:
   a first transistor having a gate coupled to the pull-up bias input, and a current path;
   a second transistor having a gate coupled to the pull-up bias input, and a current path;
   a third transistor having a gate coupled to the clock input, and a current path;
   a fourth transistor having a gate coupled to the pull-down bias input, and a current path;
   a fifth transistor having a gate and drain coupled to the drain of the first transistor, and a current path;
   a sixth transistor having a gate coupled to the gate of the fifth transistor and the drain of the first transistor, and a current path; and
   an inverter having an input coupled to the drains of the third and sixth transistors, and an output coupled to the compensated output,
   wherein the current paths of the first and second transistors are coupled between the drain of the fifth transistor and ground, and the current paths of the third and fourth transistors are coupled between the drain of the sixth transistor and ground.

2. The duty cycle correcting circuit of claim 1 wherein the first, second, third, and fourth transistors each comprise an N-channel transistor.

3. The duty cycle correcting circuit of claim 1 wherein the fifth and sixth transistors each comprise a P-channel transistor.

4. A duty cycle correcting circuit comprising:
   a duty cycle adjuster circuit having a clock input, a pull-down bias input, a pull-up bias input, and a compensated output;
   a first dual-slope integrator having a clock input and a bias output coupled to the pull-up bias input of the duty cycle adjuster circuit;
   a second dual-slope integrator having a clock input and a bias output coupled to the pull-down bias input of the duty cycle adjuster circuit; and
   an output inverter circuit having an input coupled to the compensated output of the duty cycle adjuster circuit, a first output coupled to the clock input of the first dual-slope integrator circuit, and a second output coupled to the clock input of the second dual-slope integrator circuit and for providing a duty cycle compensated output clock signal,
   wherein the first dual-slope integrator comprises:
   a first transistor having a source coupled to a power supply voltage, a gate coupled to the clock input, and a drain;
   a first resistor coupled between the drain of the first transistor and the bias output;
   a second transistor having a source coupled to ground, a gate coupled to the clock input, and a drain;
   a second resistor coupled between the drain of the second transistor and the bias output; and
   a capacitor coupled between the bias output and ground.

5. The duty cycle correcting circuit of claim 4 wherein the first transistor comprises a P-channel transistor.

6. The duty cycle correcting circuit of claim 4 wherein the second transistor comprises an N-channel transistor.

7. The duty cycle correcting circuit of claim 4 further comprising additional circuitry to allow for duty cycle correction to other than a 50% duty cycle.

8. A duty cycle correcting circuit comprising:
   a duty cycle adjuster circuit having a clock input, a pull-down bias input, a pull-up bias input, and a compensated output;
   a first dual-slope integrator having a clock input and a bias output coupled to the pull-up bias input of the duty cycle adjuster circuit;
   a second dual-slope integrator having a clock input and a bias output coupled to the pull-down bias input of the duty cycle adjuster circuit; and
   an output inverter circuit having an input coupled to the compensated output of the duty cycle adjuster circuit, a first output coupled to the clock input of the first dual-slope integrator circuit, and a second output coupled to the clock input of the second dual-slope integrator circuit and for providing a duty cycle compensated output clock signal,
   wherein the second dual-slope integrator comprises:
   a first transistor having a source coupled to a power supply voltage, a gate coupled to the clock input, and a drain;
   a first resistor coupled between the drain of the first transistor and the bias output;
   a second transistor having a source coupled to ground, a gate coupled to the clock input, and a drain;
   a second resistor coupled between the drain of the second transistor and the bias output; and
   a capacitor coupled between the bias output and ground.

9. The duty cycle correcting circuit of claim 8 wherein the first transistor comprises a P-channel transistor.

10. The duty cycle correcting circuit of claim 8 wherein the second transistor comprises an N-channel transistor.

11. The duty cycle correcting circuit of claim 8 further comprising additional circuitry to allow for duty cycle correction to other than a 50% duty cycle.

* * * * *